United States Patent
Sun et al.

(10) Patent No.: US 9,938,625 B2
(45) Date of Patent: Apr. 10, 2018

(54) METHOD FOR MANUFACTURING NDFEB RARE EARTH PERMANENT MAGNETIC DEVICE WITH COMPOSITE PLATING

(71) Applicant: SHENYANG GENERAL MAGNETIC CO., LTD., Shenyang, Liaoning (CN)

(72) Inventors: Baoyu Sun, Liaoning (CN); Xiaodong Chen, Liaoning (CN)

(73) Assignee: SHENYANG GENERAL MAGNETIC CO., LTD., Shenyang, Liaoning (CN)

( * ) Notice: Subject to any disclaimer, the term of this patent is extended or adjusted under 35 U.S.C. 154(b) by 396 days.

(21) Appl. No.: 14/662,235

(22) Filed: Mar. 18, 2015

(65) Prior Publication Data

US 2015/0194259 A1    Jul. 9, 2015

(30) Foreign Application Priority Data

Mar. 22, 2014  (CN) .......................... 2014 1 0107547

(51) Int. Cl.
C23C 28/00 (2006.01)
C23C 28/02 (2006.01)
(Continued)

(52) U.S. Cl.
CPC ............ *C23C 28/3455* (2013.01); *B22F 3/04* (2013.01); *B22F 3/12* (2013.01); *B22F 3/24* (2013.01); *B22F 7/008* (2013.01); *B22F 7/08* (2013.01); *B22F 9/08* (2013.01); *C23C 14/022* (2013.01); *C23C 14/028* (2013.01); *C23C 14/081* (2013.01); *C23C 14/083* (2013.01); *C23C 14/086* (2013.01); *C23C 14/165* (2013.01); *C23C 14/223* (2013.01); *C23C 28/021* (2013.01); *C23C 28/321* (2013.01);
(Continued)

(58) Field of Classification Search
CPC ...... C23C 14/00–14/5893; C23C 28/00–28/44
See application file for complete search history.

(56) References Cited

U.S. PATENT DOCUMENTS

| | | | | |
|---|---|---|---|---|
| 6,106,894 A | * | 8/2000 | Zapf | ........................ C23C 14/16 427/124 |
| 6,251,196 B1 | * | 6/2001 | Nishiuchi | ............. H01F 41/026 148/101 |
| 2003/0041801 A1 | * | 3/2003 | Hehmann | ............... C23C 14/14 118/715 |

FOREIGN PATENT DOCUMENTS

| | | | |
|---|---|---|---|
| CN | 1091537 C | | 9/2002 |
| CN | 1187472 C | | 2/2005 |
| CN | 101736304 | * | 6/2017 |

* cited by examiner

*Primary Examiner* — Matthew E Hoban

(57) ABSTRACT

A method for manufacturing a NdFeB rare earth permanent magnetic device with composite plating includes steps of: firstly melting alloy, casting the alloy in a melted state onto a rotation copper roller with a water cooling function, so as to be cooled for forming alloy flakes; hydrogen decrepitating; mixing after hydrogen decrepitating; jet milling after mixing; mixing under nitrogen protection before molding in a nitrogen protection magnetic field pressing machine, and then packing in a protection tank before being moved out of the protection tank and isostatic pressing; sintering in a sintering device and aging for forming a NdFeB rare earth permanent magnet; machining for forming a NdFeB rare earth permanent magnetic device; and plating the NdFeB rare earth permanent magnetic device, wherein three layers of plated films are formed.

10 Claims, 2 Drawing Sheets

(51) Int. Cl.
*C23C 14/35* (2006.01)
*B22F 3/12* (2006.01)
*B22F 3/04* (2006.01)
*B22F 7/08* (2006.01)
*B22F 7/00* (2006.01)
*B22F 9/08* (2006.01)
*C23C 14/08* (2006.01)
*C23C 14/02* (2006.01)
*C23C 14/16* (2006.01)
*C23C 14/22* (2006.01)
*B22F 3/24* (2006.01)
*H01F 41/02* (2006.01)

(52) U.S. Cl.
CPC .......... *C23C 28/324* (2013.01); *C23C 28/345* (2013.01); *H01F 41/026* (2013.01); *B22F 2003/242* (2013.01); *B22F 2998/10* (2013.01); *B22F 2999/00* (2013.01); *C22C 2202/02* (2013.01)

METHOD FOR MANUFACTURING NDFEB RARE EARTH PERMANENT MAGNETIC DEVICE WITH COMPOSITE PLATING

CROSS REFERENCE OF RELATED APPLICATION

The present invention claims priority under 35 U.S.C. 119(a-d) to CN 201410107547.1, filed Mar. 22, 2014.

BACKGROUND OF THE PRESENT INVENTION

Field of Invention

The present invention relates to a field of permanent magnetic device, and more particularly to a method for manufacturing a NdFeB rare earth permanent magnetic device with composite plating.

Description of Related Arts

NdFeB rare earth permanent magnetic materials are more and more widely used due to excellent magnetic properties thereof. For example, the NdFeB rare earth permanent magnetic materials are widely used in medical nuclear magnetic resonance imaging, computer hard disk drivers, stereos, cell phones, etc. With the requirements of energy efficiency and low-carbon economy, the NdFeB rare earth permanent magnetic materials are also used in fields such as automobile parts, household appliances, energy conservation and control motors, hybrid cars and wind power.

Conventionally, surface treatment technologies of rare earth permanent magnetic devices are mainly Ni—Cu—Ni electroplating, Zn electroplating, electrophoresis, spraying, etc. Vacuum aluminum plating method is also used. For example, Chinese patent ZL96192129.3 discloses a method of vacuum plating with Ti and AlN; another Chinese patent ZL01111757.5 discloses a method of vacuum evaporation plating with zinc, aluminum, tin and magnesium.

Prior art is shown in FIG. 1, wherein two supporting parts 7 are arranged on an upper portion inside a vacuum chamber 1, and are able to rotate around a shaft 6 along a horizontal axis. Six cylinders 5 made of stainless steel mesh are arranged in a magnetic part 14. Axles 8 are arranged in an external circular direction of the shaft 6 of the supporting part 7 and are supported in a loop form, for rotating around the shaft 6. A plurality of heating boats 2, as evaporating sections of aluminum wires 9 for being evaporated, are arranged on a heating boat supporter 4 extending out from a supporting platform 3 in a lower portion of the vacuum chamber 1. The aluminum wires 9 are mounted and wound around a feeding roller 10 under the supporting platform 3. A front end of the aluminum wire 9 is guided by a heat-resistance protection tube 11 facing an internal surface of the heating boat, for reaching the heating boat. A concave opening 12 is arranged in a section of the heat-resistance protection tube, in such a manner that a gear 13 is mounted corresponding to the concave opening 12 and is directly contacted with the aluminum wire 9. Therefore, by moving the aluminum wire 9 forward, the heating boat 2 is constantly fed, and the aluminum wire 9 is heated for evaporation and deposition on the magnetic part 14 in the rotating cylinder 5 for completing surface aluminum plating.

Conventionally, film plating uses evaporation, resulting in a poor combining force between a film layer and a base, and insufficient improvement of anti-corrosion capacity of the permanent magnetic devices. Magnetron sputtering coating is also conventionally used. Because of low efficiency thereof, magnetron sputtering is unsuitable for low-cost mass production. Some of the prior art have problems of loading, which means loading is not easy and production is difficult. Multi-arc ion plating is also conventionally used. Because of big particles, multi-arc ion plating is not able to reach anti-corrosion requirements of the permanent magnetic device. For overcoming shortcomings of multi-arc ion plating, conventional artisans combine multi-arc ion plating with magnetron sputtering coating, but requirements of high efficiency, low cost and mass production are still not met, and device structure has defects. Especially, conventional rare earth permanent magnetic device electroplating chemical treatment consumes a lot of energy, generates pollution, and requires expensive water treatment equipment, while improper treatment will seriously affect ecological environment. However, according to the present invention, production is provided in vacuum and no pollution material is used, which causes no ecological environment pollution. In the same time, battery effect during electroplating on magnetic performance is lowered. Accordingly, the present invention provides a vacuum composite plating equipment for the rare earth permanent magnetic device, so as to overcome shortcomings of conventional technologies. In addition, NdFeB rare earth permanent magnetic devices produced with the device in the present invention are improved not only in anti-corrosion capacity, bust also in magnetic performance, which significantly improves magnetic energy product and coercivity of the rare earth permanent magnetic devices, saves rare earth resources, and especially saves heavy rare earth which is even rarer.

SUMMARY OF THE PRESENT INVENTION

An object of the present invention is to provide a method for manufacturing a NdFeB rare earth permanent magnetic device with composite plating, and improve magnetic performance and anti-corrosion ability of the rare earth permanent magnetic device with the following embodiments.

Accordingly, in order to accomplish the above object, the present invention provides: a composite plating equipment for a NdFeB rare earth permanent magnetic device, comprising: a vacuum chamber, a gas inputting system, a cylinder cathode magnetron target, a flat cathode magnetron target, a cathode multi-arc ion target, an anode layer linear ion source, a rotation frame and a material tank; wherein the vacuum chamber comprises a horizontal vacuum shell, a front gate and a back cap; the front gate and the horizontal vacuum shell are sealed by a rubber sealing ring; the back cap is welded on the horizontal vacuum shell or connected to the horizontal vacuum shell through a connecting part; a transmitting device of the rotation frame is installed on the back cap; a motor transmitting shaft outside the vacuum chamber extends into the vacuum chamber through a movable sealing device; the rotation frame is arranged in the vacuum chamber, and is supported by a frame through a first shaft; the frame is mounted on the horizontal vacuum shell; an axis of the rotation frame is parallel to an axis of the horizontal vacuum shell; two second shafts are respectively arranged at two ends of the material tank which is in a net shape for installing the material tank on the rotation frame; the axis of the rotation frame is parallel to an axis of each of the two second shafts; the rotation frame revolves around the axis of the horizontal vacuum shell, in such a manner that the material tank in the net shape revolves with the rotation frame while rotates.

The cylinder cathode magnetron target is installed on the back cap of the vacuum chamber; a power, cooling water and a driving device are introduced into the cylinder cathode magnetron target from outside. The cylinder cathode magnetron target is arranged inside the rotation frame; an axis of the cylinder cathode magnetron target is parallel to the axis of the rotation frame; wherein a quantity of the cylinder cathode magnetron target is no less than one.

A plurality of magnetic rings, which are axially magnetized, are installed in the cylinder cathode magnetron target, a plurality of magnetic guiding rings are arranged between the magnetic rings, and the magnetic rings axially move back and forth relating to the cylinder cathode magnetron target.

A plurality of magnetic strips, which are radically magnetized, are installed in the cylinder cathode magnetron target, the magnetic strips are arranged along a circumference of the cylinder cathode magnetron target with intervals; a quantity of the magnetic strips is no less than three; the magnetic strips coaxially rotate relating to the cylinder cathode magnetron target.

The magnetic rings or the magnetic strips are made of a NdFeB rare earth permanent magnet material.

The flat cathode magnetron target is installed on the vacuum shell and is distributed outside the rotation frame; a loop magnetic strip in a racetrack shape is arranged inside the flat cathode magnetron target, the loop magnetic strip is made of a NdFeB rare earth permanent magnet material, and is cooled by cooling water; a quantity of the loop magnetic strip is no less than one.

The cathode multi-arc ion target is installed on the vacuum shell and is distributed outside the rotation frame; the cathode multi-arc ion target is rectangular or circular, and a magnet is arranged inside the cathode multi-arc ion target; the magnet is made of a NdFeB rare earth permanent magnet material, and is cooled by cooling water; a quantity of the magnet is no less than one.

The anode layer linear ion source is installed inside on the vacuum shell and is distributed outside the rotation frame.

A heater is arranged in the vacuum chamber, a heating temperature is 100-600° C.

A method for manufacturing a NdFeB rare earth permanent magnetic device with composite plating is also provided, comprising steps of:

firstly melting alloy, casting the alloy in a melted state onto a rotation copper roller with a water cooling function, so as to be cooled for forming alloy flakes;

secondly hydrogen decrepitating;

mixing after hydrogen decrepitating;

jet milling after mixing;

after jet milling, mixing under nitrogen protection before molding in a nitrogen protection magnetic field pressing machine, and then packing in a protection tank before being moved out of the protection tank and isostatic pressing;

after isostatic pressing, sintering in a sintering device and aging for forming a NdFeB rare earth permanent magnet;

machining the NdFeB rare earth permanent magnet for forming a NdFeB rare earth permanent magnetic device; and plating the NdFeB rare earth permanent magnetic device, wherein three layers of plated films are formed; a first layer is a first magnetron sputtering coated film with a thickness of 0.02-5 µm; a second layer is a composite plated film formed by magnetron sputtering coating and multi-arc ion plating, with a thickness of 1-10 µm; and a third layer is a second magnetron sputtering coated film with a thickness of 0.1-5 µm.

There are three layers of the plated films; the first layer is the first magnetron sputtering coated film, and a film material thereof is Dy—Al or Tb—Al; the second layer is the composite plated film formed by magnetron sputtering coating and multi-arc ion plating, and a film material thereof is selected from a group consisting of Al and Ni—Cr; and the third layer is the second magnetron sputtering coated film, and a film material thereof is Al.

A target material is selected from a group consisting of Al, Dy—Al, Tb—Al, Dy—Fe, Tb—Fe, Ni—Cr, Ti, Mo, Si, $Al_2O_3$, $ZrO_2$ and AZO.

Preferably, a film system of the NdFeB rare earth permanent magnetic device is selected from a group consisting of Al, Dy—Al, Tb—Al, Dy—Fe and Tb—Fe.

Preferably, a film system of the NdFeB rare earth permanent magnetic device is selected from a group consisting of Al, Ni—Cr, Ti, Mo, Si, $Al_2O_3$, $ZrO_2$ and AZO.

Preferably, a film system of the NdFeB rare earth permanent magnetic device is Al.

The gas inputting system inputs no less than one kind of gas.

The gas inputted is selected from a group consisting of argon, nitrogen, oxygen and hydrogen.

Preferably, the gas inputted is argon.

During the composite plating, the argon and the oxygen gas is inputted, and an oxygen/argon volume fraction is 0.1-5%. By inputting the oxygen, a resistivity of the NdFeB rare earth permanent magnetic device is increased, which decreases vortex and increases a magnet using temperature.

A vacuum pump is selected from a group consisting of mechanical vacuum pump, roots vacuum pump, oil diffusion pump and molecular pump.

A magnetron sputtering coating condition is: a temperature of 30-600° C., a deposition pressure of 0.1-1 Pa under an argon condition; a power density of 1-20 w/cm$^2$, a linear ion source working condition is: a discharge voltage of 100-3000V, an ion energy of 100-2000 eV, and a working pressure of 0.01-1 Pa under the argon condition, wherein during the composite plating, the magnetron sputtering coating and the multi-arc ion plating are utilized separately, alternatively or simultaneously.

After machining, the NdFeB rare earth permanent magnetic device is processed with composite plating, wherein three layers of the plated films are formed; the first layer is the first magnetron sputtering coated film with the thickness of 0.02-5 µm; the second layer is the composite plated film formed by magnetron sputtering coating and multi-arc ion plating, with the thickness of 1-10 µm; and the third layer is the second magnetron sputtering coated film with the thickness of 0.1-5 µm.

There are three layers of the plated films; the first layer is the first magnetron sputtering coated film, and a film material thereof is a material selected from a group consisting of Al, Dy—Al, Tb—Al, Dy—Fe and Tb—Fe; the second layer is the composite plated film formed by magnetron sputtering coating and multi-arc ion plating, and a film material thereof is selected from a group consisting of Al, Ni—Cr, Ti, Mo, Si, $Al_2O_3$, $ZrO_2$ and AZO; and the third layer is the second magnetron sputtering coated film, and a film material thereof is selected from a group consisting of Al, Ni—Cr, Ti, Mo, Si, $Al_2O_3$, $ZrO_2$ and AZO.

Preferably, there are three layers of the plated films; the first layer is the first magnetron sputtering coated film, and a film material thereof is a material selected from a group consisting of Dy—Al, Tb—Al, Dy—Fe and Tb—Fe; the second layer is the composite plated film formed by magnetron sputtering coating and multi-arc ion plating, and a film material thereof is selected from a group consisting of Al, Ni—Cr, $Al_2O_3$, $ZrO_2$ and AZO; and the third layer is the second magnetron sputtering coated film, and a film material thereof is selected from a group consisting of Al, Ni—Cr, $Al_2O_3$, $ZrO_2$ and AZO.

Preferably, there are three layers of the plated films; the first layer is the first magnetron sputtering coated film, and a film material thereof is selected from a group consisting of Al and Ni—Cr; the second layer is the composite plated film formed by magnetron sputtering coating and multi-arc ion plating, and a film material thereof is selected from a group consisting of Al and Ni—Cr; and the third layer is the second magnetron sputtering coated film, and a film material thereof is selected from a group consisting of Al and Ni—Cr.

The method further comprises a step of blasting before the composite plating, wherein blasting material is selected from a group consisting of quartz, glass bead, aluminum oxide, cerium oxide, lanthanum oxide, a mixture of cerium oxide and lanthanum oxide, and zirconium oxide.

The method further comprises a step of spraying before composite plating, wherein a spraying material is aluminum, an aluminum compound, or an electrophoresis paint.

The method further comprises a step of: during the composite plating, heating the NdFeB rare earth permanent magnetic device for controlling plating, wherein a temperature is 100-600° C.

The method further comprises a step of: after the composite plating, processing the NdFeB rare earth permanent magnetic device with heat treatment.

A heat treatment temperature is 110-890° C.

The heating process of the heat treatment is provided under vacuum or protection gas.

A horizontal composite plating equipment for the NdFeB rare earth permanent magnetic device is installed in a clean factory, a clean level thereof is no less than 10000.

Referring to a metallographic analysis, in a range of 0-1 mm extending inwardly from an external surface of the NdFeB rare earth permanent magnetic device with the composite plating, a heavy rare earth content in a main phase grain within the range is higher than a heavy rare earth content in a main phase grain inside the NdFeB rare earth permanent magnetic device; heavy rare earth with a high content is distributed outside a main phase $R_2T_{14}B$, and forms a structure of $RH_2T_{14}B$ surrounding $R_2T_{14}B$; a $RH_2T_{14}B$ phase and a $R_2T_{14}B$ phase have no grain boundary phase; wherein R refers to rare earth in a main phase of a metallographic structure of a NdFeB rare earth permanent magnet, T refers to Fe and Co, and RH refers to rare earth in the main phase comprising the heavy rare earth with a content higher than an average value.

Advantages of the present invention are as follows. The method for manufacturing the NdFeB rare earth permanent magnetic device with the composite plating is provided, which improves anti-corrosion ability of the NdFeB rare earth permanent magnetic device, in such a manner that NdFeB rare earth permanent magnetic device is applicable for fields with high anti-corrosion requirements such as offshore wind power and hybrid electric vehicle. Application of the NdFeB rare earth permanent magnet is widened. In general, surface layers of the NdFeB rare earth permanent magnetic device will lower the magnetic performance According to the present invention, the magnetic performance of the NdFeB rare earth permanent magnetic devices is improved, especially in magnetic energy product and coercivity, which provides a novel method for improving the magnetic performance of the NdFeB rare earth permanent magnetic devices, and is significant for saving rare earth resources and protecting rare natural resources.

These and other objectives, features, and advantages of the present invention will become apparent from the following detailed description, the accompanying drawings, and the appended claims.

BRIEF DESCRIPTION OF THE DRAWINGS

Referring to drawings, the present invention is further illustrated.

Element reference: 1-vacuum chamber, 2-heating boat, 3-supporting platform, 4-heating boat supporter, 5-cylinder, 6-shaft, 7-supporting part, 8-axle, 9-aluminum wire, 10-feeding roller, 11-heat-resistance protection tube, 12-concave opening, 13-gear, 14-magnetic part, 15-horizontal vacuum shell, 16-anode layer linear ion source, 17-multi-arc ion source, 18-vacuum pump, 19-flat cathode magnetron target, 20-heating device, 21-first driving gear, 22-first driven gear, 23-second driving gear, 24-second driven gear, 25-rotation frame, 26-material tank, 27-permanent magnetic device, 28-cylinder cathode magnetron target, 29-first shaft, 30-second shaft, 31-evacuating pipeline.

DETAILED DESCRIPTION OF THE PREFERRED EMBODIMENT

Figure 1:
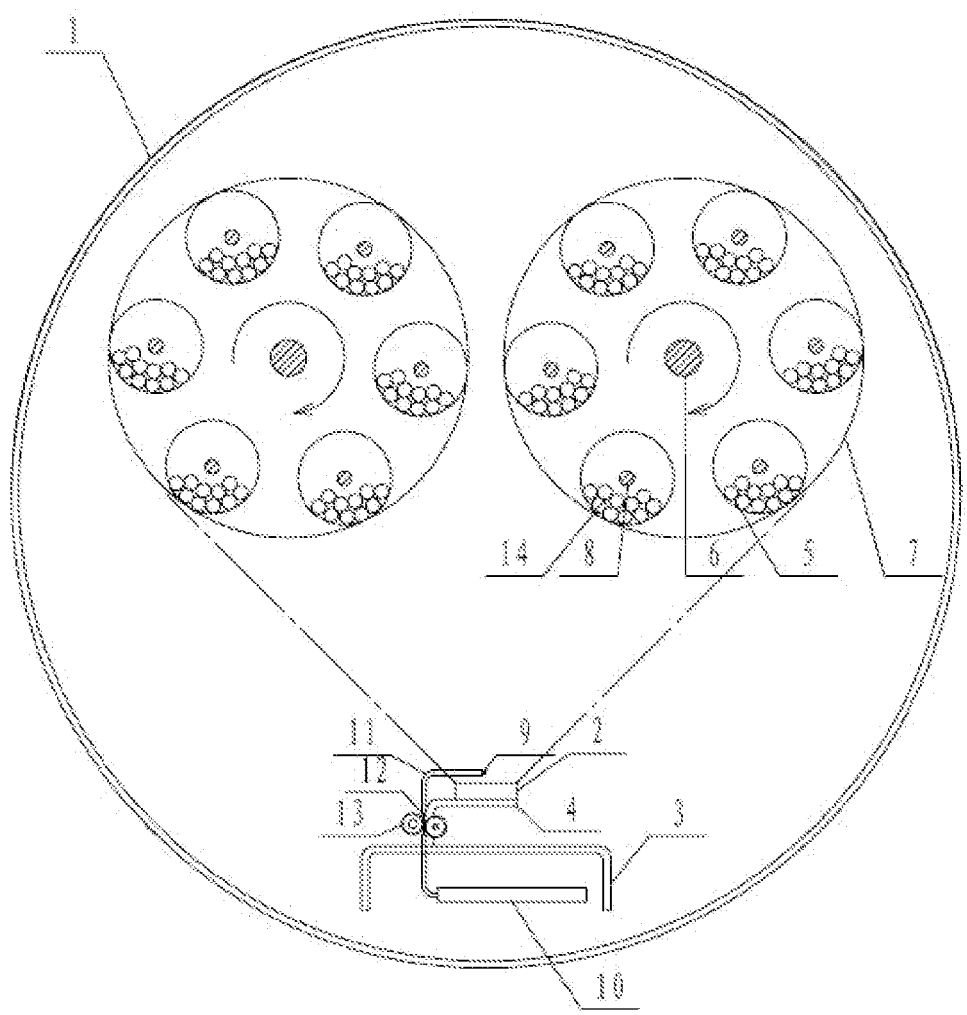
FIG. 1 is a sketch view of vacuum plating according to a prior art.
Figure 2:
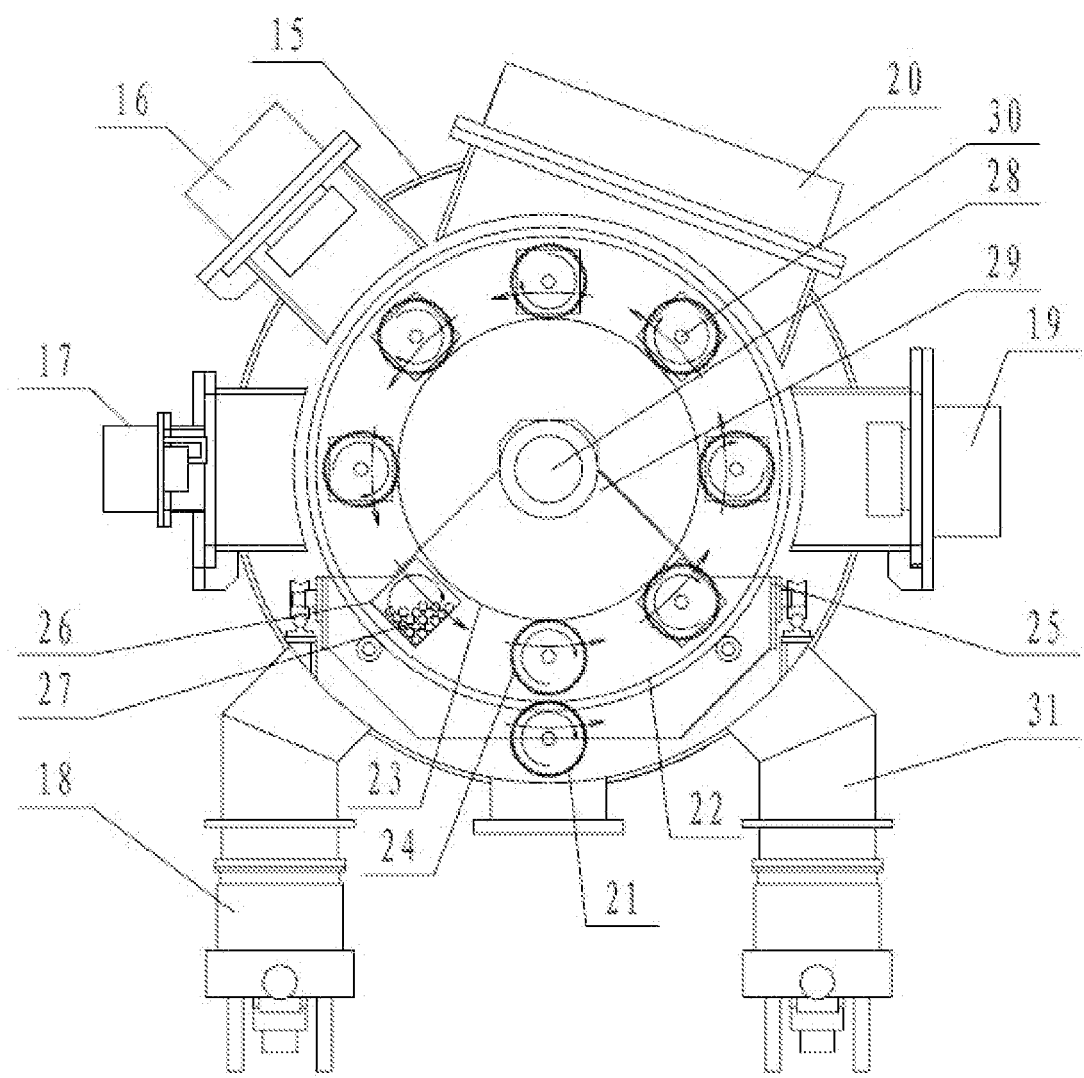
FIG. 2 is a sketch view of vacuum plating according to the present invention.

Referring to FIG. 2, the present invention provides a composite plating equipment combining magnetron sputtering coating and multi-arc ion plating, wherein a cylinder cathode magnetron target 28 is arranged at an axis of a horizontal vacuum shell 15 connected to a vacuum pump 18; a plurality of (eight as shown in FIG. 2) material tanks 26 formed by stainless steel nets are arranged on a periphery of a rotation frame 25; and a plurality of permanent magnetic devices 27 are arranged in every material tank 26. A motor (not shown) outside a vacuum chamber 1 is connected to a first driving gear 21 through a movable sealing transmitting shaft for driving a first driven gear 22 mounted on the rotation frame 25, in such a manner that the rotation frame 25 revolves around a first shaft 29. A second driving gear 23 mounted on the horizontal vacuum shell 15 drives a second driven gear 24 to rotate around a second shaft 30 through revolving to the rotation frame 25. Shafts are arranged at two ends of the material tank 26 for being connected to the second shaft 30, in such a manner that the material tank revolves while rotates for stirring the permanent magnetic devices 27 in the material tanks 26, so as to evenly deposit a target material thereon. An anode layer linear ion source 16, a plurality of multi-arc ion sources 17, an evacuating pipeline 31 connected to the vacuum pump 18, a plurality of flat cathode magnetron targets 19 and a heating device 20 are arranged outside the horizontal vacuum shell 15.

Before plating, the vacuum chamber 1 is evacuated to an order of $10^{-4}$ Pa, and is inputted with argon gas; a working pressure is 0.01-1 Pa. The material tank 26 revolves while rotates. The anode layer linear ion source 16 is started, a discharging voltage thereof is 100-3000V. Ions hit the permanent magnetic devices 27 for 5-10 min Every material tank 26 is insulated, or is powered with a voltage of −50-200V. Pre-cleaning with ion hitting is for cleaning oxide and carbon hydride on a surface of the permanent magnetic device 27, in such a manner that the surface is roughened, so as to improve effects of surface energy and ion assisted deposition. The heating device 20 heats the material tanks 26 and the permanent magnetic devices 27 to a temperature of 120-600° C., for removing moisture and improving film adhesion. During plating, a temperature is raised to 200° C., every material tank 26 revolves while rotates and is cleaned by high-pressure ions; the vacuum chamber 1 is evacuated again to the order of $10^{-4}$ Pa, and is inputted with the argon gas; the working pressure is 0.1-1 Pa; the flat cathode magnetron targets 19, the cylinder cathode magnetron target 28 and the multi-arc ion sources 17 are started separately, alternatively or simultaneously, for depositing the target material on the permanent magnetic devices 27, so as to form layers of a elemental film and a dielectric film.

The present invention is further illustrated with the following preferred embodiments.

Preferred Embodiment 1

A method comprises steps of:
1) melting 600 Kg alloy selected from A1, A2, A3 and A4 in Table 1, casting the alloy in a melted state onto a rotation copper roller with a water cooling function, so as to be cooled for forming alloy flakes; hydrogen decrepitating; mixing after hydrogen decrepitating; jet milling after mixing; mixing under nitrogen protection before molding in a nitrogen protection magnetic field pressing machine, wherein an oxygen content in a protection tank is 150 ppm, an orientation magnetic field strength is 1.8 T, an in-chamber temperature is 2° C., a size of the magnet is 62×52×42 mm, and an orientation direction is a 42 size direction; and then packing in the protection tank before being moved out of the protection tank and isostatic pressing with a pressure of 200 MPa, sintering in a sintering device and aging; and
2) after sintering, machining for forming a sheet with a size of 30×20×10 mm; selectively processing the sheet with chamfer, blasting, aluminum spraying, electrophoresis and spraying; then providing vacuum plating, wherein a first layer is a first magnetron sputtering coated film, a second layer is a composite plated film formed by magnetron sputtering coating and multi-arc ion plating, and a third layer is a second magnetron sputtering coated film, wherein thicknesses thereof are respectively 0.02-5 μm, 0.1-15 μm and 1-5 μm; wherein in some experiments, a fourth layer is formed, the fourth layer is a fourth magnetron sputtering coated film with a thickness of 0.1-5 μm; if there are only three layers, then no elemental symbol is marked on the fourth layer; results of materials, magnetic performances and anti-corrosion ability of each layer are shown in Table 2.

TABLE 1 components of rare earth permanent alloys in preferred embodiments and contrast example

| No. | Component |
| --- | --- |
| A1 | $Nd_{30}Dy_1Fe_{67.9}B_{0.9}A_{10.2}$ |
| A2 | $Nd_{30}Dy_1Fe_{67.5}Co_{1.2}Cu_{0.1}B_{0.9}Al_{0.1}$ |
| A3 | $(Pr_{0.2}Nd_{0.8})_{25}Dy_5Fe_{67.4}Co_{1.2}Cu_{0.3}B_{0.9}Al_{0.2}$ |
| A4 | $(Pr_{0.2}Nd_{0.8})_{25}Dy_5Tb_1Fe_{65}Co_{2.4}Cu_{0.3}B_{0.9}Al_{0.2}Ga_{0.1}Zr_{0.1}$ |

TABLE 2 results of layer materials, magnetic performance and anti-corrosion abilities according to the present invention

| No. | No. | Pre-treatment | First layer | Second layer | Third layer | Magnetic product (MGOe) | Coercivity (KOe) | Neutral salt spray (h) | PCT (h) |
| --- | --- | --- | --- | --- | --- | --- | --- | --- | --- |
| 1 | A1 | chamfer | Al | Al + Al | Al | 47.9 | 17.7 | 210 | 85 |
| 2 | A1 | blasting | Al | Si + Al | Al | 48.3 | 18.9 | 220 | 90 |
| 3 | A1 | blasting | ZrO₂ | Al + Ti | Al | 48.5 | 18.8 | 225 | 93 |
| 4 | A1 | blasting | Tb—Al | Al + Al | Al | 48.7 | 18.7 | 215 | 92 |
| 5 | A2 | blasting | Dy—Fe | Ni—Cr + Al | Ni—Cr | 49.6 | 20.3 | 205 | 98 |
| 6 | A2 | chamfer | Tb—Fe | AZO + Al | AZO | 49.2 | 20.5 | 220 | 105 |
| 7 | A2 | blasting | Dy—Al | Mo + Ti | Mo | 49.3 | 20.4 | 228 | 123 |
| 8 | A2 | chamfer | Dy—Al | AZO + Al | AZO | 49.1 | 20.6 | 217 | 112 |
| 9 | A3 | blasting | Dy—Fe | Mo + Ni—Cr | Ni—Cr | 41.7 | 25.8 | 224 | 135 |
| 10 | A3 | chamfer | Dy—Fe | Ni—Cr + Ni—Cr | Ni—Cr | 41.4 | 25.4 | 216 | 120 |
| 11 | A3 | chamfer | Ti | Ti + Al | Ti | 41.6 | 25.1 | 235 | 130 |
| 12 | A3 | chamfer | Ni—Cr | Ni—Cr + Al | Ni—Cr | 41.3 | 25.2 | 222 | 102 |
| 13 | A4 | blasting | Mo | Mo + Al | Mo | 42.6 | 26.9 | 234 | 103 |
| 14 | A4 | blasting | Si | Si + Al | Si | 43.1 | 27.5 | 196 | 86 |
| 15 | A4 | blasting | AZO | AZO + Al | AZO | 43.4 | 27.3 | 198 | 76 |
| 16 | A4 | aluminum spraying | Al₂O₃ | Al₂O₃ + Al | Al₂O₃ | 42.8 | 26.8 | 213 | 83 |
| 17 | A4 | blasting | ZrO₂ | ZrO₂ + Al | ZrO₂ | 43.3 | 27.1 | 205 | 78 |

Contrast Example 1

Melting 600 Kg alloy selected from A1, A2, A3 and A4 in Table 1, casting the alloy in a melted state onto a rotation copper roller with a water cooling function, so as to be cooled for forming alloy flakes; coarsely decrepitating with a vacuum hydrogen decrepitating furnace; jet milling after decrepitating; mixing under nitrogen protection before molding in a nitrogen protection magnetic field pressing machine, wherein an orientation magnetic field strength is 1.8 T, a size of the magnet is 62×52×42 mm, and an orientation direction is a 42 size direction; and then packing in the protection tank before being moved out of the protection tank and isostatic pressing with a pressure of 200 MPa; then sintering in a vacuum sintering device and aging; and machining for forming a sheet with a size of 30×20×10 mm; selectively processing the sheet with chamfer and blasting; then providing Ni—Cu—Ni electroplating, wherein results of magnetic performance and anti-corrosion ability are shown in Table 3.

TABLE 3 results of magnetic performance and anti-corrosion ability in contrast example

| No. | No. | Pre-treatment | First layer | Second layer | Third layer | Magnetic product (MGOe) | Coercivity (KOe) | Neutral salt spray (h) | PCT (h) |
|---|---|---|---|---|---|---|---|---|---|
| 18 | B1 | blasting | Ni | Cu | Ni | 47.3 | 17.1 | 50 | 24 |
| 19 | B2 | blasting | Ni | Cu | Ni | 48.7 | 18.9 | 55 | 30 |
| 20 | B3 | chamfer | Ni | Cu | Ni | 40.1 | 23.6 | 60 | 35 |
| 21 | B4 | chamfer | Ni | Cu | Ni | 39.3 | 26.2 | 70 | 40 |

Preferred Embodiment 2

The components in the preferred embodiment 1 are selected for manufacturing a NdFeB rare earth permanent magnetic device, wherein a first layer is made of a Dy—Al alloy, a second layer is made of A1+A1, and a third layer is made of A1. Results thereof are shown in Table 4. No. 1 is a contrast example without heating and heat treatment. Referring to Table 4, a plating temperature and a heat treatment temperature after plating have effects on the magnetic performance of the materials and significantly improve coercivity, which means that by increasing a working temperature of the magnets, heavy rare earth is less used at the same using temperature, which saves rare resources.

TABLE 4 effects caused by plating temperature and heat treatment temperature on magnetic performance and anti-corrosion ability

| No. | No. | Pre-treatment | Plating temperature (° C.) | Heat treatment temperature (° C.) | Magnetic product (MGOe) | Coercivity (KOe) | Neutral salt spray (h) | PCT (h) |
|---|---|---|---|---|---|---|---|---|
| 1 | A1 | chamfer | — | — | 47.4 | 17.5 | 220 | 85 |
| 2 | A1 | blasting | 100 | 810 | 48.5 | 19.9 | 230 | 95 |
| 3 | A1 | blasting | 150 | 710 | 48.7 | 19.8 | 235 | 99 |
| 4 | A1 | blasting | 200 | 610 | 48.9 | 19.7 | 225 | 94 |
| 5 | A2 | blasting | 250 | 490 | 49.3 | 21.3 | 215 | 97 |
| 6 | A2 | chamfer | 300 | 410 | 49.6 | 21.5 | 230 | 115 |
| 7 | A2 | blasting | 350 | 360 | 49.5 | 21.4 | 229 | 133 |
| 8 | A2 | chamfer | 400 | 310 | 49.7 | 21.6 | 227 | 122 |
| 9 | A3 | blasting | 450 | 280 | 41.6 | 26.8 | 236 | 145 |
| 10 | A3 | chamfer | 500 | 260 | 41.5 | 25.9 | 224 | 135 |
| 11 | A3 | chamfer | 550 | 200 | 41.9 | 25.7 | 239 | 148 |
| 12 | A3 | chamfer | 600 | 110 | 41.7 | 25.6 | 227 | 108 |

Note:
1) anti-corrosion ability (PCT experiment) Condition: sample 10 × 10 × 10 mm, 2 atm, 120° C., 100% moisture, 48 h, weight loss less than 5 mg/cm$^2$.
2) salt spray experiment: Condition: 5% NaCl solution, 25° C., no less than 48 h, no surface change.

In the preferred embodiment 2, blasting is provided before vacuum plating, because: during manufacturing of the rare earth permanent magnetic device, oil and dirt are on a surface, which will greatly decrease stability of vacuum plating and the anti-corrosion ability of plated products. Therefore, reasonable cleaning device and technique are basic assurance of quality and performance of rare earth permanent device vacuum plating. Sufficient adhesion is only able to be guaranteed by the reasonable cleaning device. A blasting material is selected from a group consisting of quartz, glass bead, aluminum oxide, cerium oxide, lanthanum oxide, a mixture of cerium oxide and lanthanum oxide, and zirconium oxide; and spraying is provided before the composite plating, wherein a spraying material is aluminum, an aluminum compound, or an electrophoresis paint.

In the preferred embodiment 2, high-pressure ion cleaning is provided during plating: wherein the vacuum chamber is evacuated to an order of $10^{-4}$ Pa, and is inputted with argon gas; a working pressure is 0.01-1 Pa. The material tank revolves while rotates. The anode layer linear ion source is started, a discharging voltage thereof is 100-3000V. Ions hit the permanent magnetic devices for 5-10 min. The material tank is insulated, or is powered with a voltage of −50-200V.

In the preferred embodiment 2, a plating configuration is as follows. A reasonable configuration comprises: a single and a double magnetron configuration (comprising flat and cylinder rotation magnetron cathode configurations), a multi-arc cathode configuration, an anode layer linear ion source, a heating device and a vacuum pump. Different plating configurations will lead to different production rates, ion energy, etc., and have a significant effect on plated product performance. The vacuum chamber is evacuated to an order more than $10^{-4}$ Pa, and is inputted with the argon gas; a working pressure is $3\times10^{-1}$ Pa. The material tank revolves while rotates. Magnetron sputtering deposition and are evaporation deposition work separately, alternatively or simultaneously; magnetron sputtering deposition as well as arc evaporation deposition, and ion hitting work separately or alternatively.

In the preferred embodiment 2, material feeding during the plating is as follows. A structure of the material tank has a great effect on appearance of the plated production and quality of the layers. Therefore, surface scratching and other physical damage should be avoided. The material tank is a cylinder or polygonal column made of stainless steel net. A plurality of isolated spaces are formed by isolating boards in the material tank, and no less than one permanent magnetic device is arranged in each space.

In the preferred embodiment 2, after the composite plating, the heat treatment is provided, wherein a heat treatment temperature is 100-900° C.

It is further illustrated by the preferred embodiments and the contrast example that significantly improving magnetic performance and anti-corrosion ability with the present invention has a brilliant future.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method for manufacturing a NdFeB rare earth permanent magnetic device with composite plating, comprising steps of:
   firstly melting alloy, casting the alloy in a melted state onto a rotation copper roller with a water cooling function, so as to be cooled for forming alloy flakes;
   secondly hydrogen decrepitating the alloy flakes obtained in the step one;
   mixing hydrogen decrepitated flakes;
   jet milling mixed flakes;
   after jet milling, mixing milled flakes under nitrogen protection before molding in a nitrogen protection magnetic field pressing machine, and then packing in a protection tank before being moved out of the protection tank and isostatic pressing;
   after isostatic pressing, sintering and aging pressed flakes for forming a NdFeB rare earth permanent magnet;
   machining the NdFeB rare earth permanent magnet for forming a NdFeB rare earth permanent magnetic device; and
   processing the NdFeB rare earth permanent magnetic device in a vacuum chamber with a composite plating of magnetron sputtering coating and multi-arc ion plating, wherein three layers of plated films are formed; a first layer is a first magnetron sputtering coated film with a thickness of 0.02-5 μm; a second layer is a composite plated film formed by magnetron sputtering coating and multi-arc ion plating, with a thickness of 1-10 μm; and a third layer is a second magnetron sputtering coated film with a thickness of 0.1-5 μm.

2. The method, as recited in claim 1, wherein a heater is arranged in the vacuum chamber, a heating temperature of the heater is 30-600° C.

3. The method, as recited in claim 1, further comprising a step of: after the composite plating, processing the NdFeB rare earth permanent magnetic device with heat treatment, wherein a heat treatment temperature is 60-900° C.

4. The method, as recited in claim 1, wherein an anode layer linear ion source is arranged in the vacuum chamber, a composite plating condition for processing the NdFeB rare earth permanent magnetic device is: a temperature of 30-600° C., a deposition pressure of 0.1-1 Pa under an argon condition; a power density of 1-20 w/cm$^2$, a linear ion source working condition is, a discharge voltage of 100-3000V, an ion energy of 100-2000 eV, and a working pressure of 0.01-1 Pa under the argon condition, wherein during the composite plating, the magnetron sputtering coating and the multi-arc ion plating are utilized separately, alternatively or simultaneously.

5. The method, as recited in claim 1, wherein during the composite plating, argon and oxygen gas is inputted into the vacuum chamber, and an oxygen volume is 0.1-5% of an argon volume.

6. The method, as recited in claim 1, wherein the composite plating is physical vapor deposition; a magnetron sputtering coated film material is a material selected from a group consisting of Al, Dy—Al, Tb—Al, Dy—Fe, Tb—Fe, Ti, Mo, Si, stainless steel, Al$_2$O$_3$, ZrO$_2$ and AZO; a material of the composite plated film formed by magnetron sputtering coating and multi-arc ion plating is selected from a group consisting of Al, Ti, Mo, Si, stainless steel, Al$_2$O$_3$, ZrO$_2$, ITO and AZO.

7. The method, as recited in claim 1, further comprising steps of: blasting the NdFeB rare earth permanent magnetic device before composite plating, wherein a blasting material is selected from a group consisting of quartz, glass bead, aluminum oxide, cerium oxide, lanthanum oxide, a mixture of cerium oxide and lanthanum oxide, and zirconium oxide; and spraying the NdFeB rare earth permanent magnetic device before composite plating, wherein a spraying material is aluminum, an aluminum compound, or an electrophoresis paint.

8. The method, as recited in claim 1, wherein there are three layers of the plated films; the first layer is the first magnetron sputtering coated film, and a film material thereof is a material selected from a group consisting of Al, Dy—Al, Tb—Al, Dy—Fe, and Tb—Fe; the second layer is the composite plated film formed by magnetron sputtering coating and multi-arc ion plating, and a film material thereof is selected from a group consisting of Al, Ni—Cr, Ti, Mo, Si, $Al_2O_3$, $ZrO_2$, and AZO; and the third layer is the second magnetron sputtering coated film, and a film material thereof is selected from a group consisting of Al, Ni—Cr, Ti, Mo, Si, $Al_2O_3$, $ZrO_2$, and AZO.

9. The method, as recited in claim 1, wherein there are three layers of the plated films; the first layer is the first magnetron sputtering coated film, and a film material thereof is Dy—Al or Tb—Al; the second layer is the composite plated film formed by magnetron sputtering coating and multi-arc ion plating, and a film material thereof is selected from a group consisting of Al and Ni—Cr; and the third layer is the second magnetron sputtering coated film, and a film material thereof is Al.

10. The method, as recited in claim 1, wherein in a range of 0-0.5 mm extending inwardly from an external surface of the NdFeB rare earth permanent magnetic device with the composite plating, a heavy rare earth content in a main phase grain within the range is higher than a heavy rare earth content in a main phase grain inside the NdFeB rare earth permanent magnetic device; heavy rare earth with a high content is distributed outside a main phase $R_2T_{14}B$, and forms a structure of $RH_2T_{14}B$ surrounding $R_2T_{14}B$; a $RH_2T_{14}B$ phase and a $R_2T_{14}B$ phase have no grain boundary phase; wherein R refers to rare earth in a main phase of a metallographic structure of a NdFeB rare earth permanent magnet, T refers to Fe and Co, and RH refers to rare earth in the main phase comprising the heavy rare earth with a content higher than an average value.

\* \* \* \* \*